United States Patent
Xianyu et al.

(10) Patent No.: US 8,445,332 B2
(45) Date of Patent: May 21, 2013

(54) SINGLE CRYSTAL SILICON ROD FABRICATION METHODS AND A SINGLE CRYSTAL SILICON ROD STRUCTURE

(75) Inventors: Wenxu Xianyu, Suwon-si (KR); Young-soo Park, Yongin-si (KR); Hans S. Cho, Seoul (KR); Huaxiang Yin, Yongin-si (KR); Hyuck Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 545 days.

(21) Appl. No.: 11/976,009

(22) Filed: Oct. 19, 2007

(65) Prior Publication Data

US 2008/0118754 A1    May 22, 2008

(30) Foreign Application Priority Data

Nov. 17, 2006 (KR) .................. 10-2006-0113898

(51) Int. Cl.
    *H01L 21/00*      (2006.01)
    *H01L 21/84*      (2006.01)

(52) U.S. Cl.
    USPC ........... 438/149; 438/166; 438/222; 438/482; 438/487; 257/347; 257/E21.09

(58) Field of Classification Search
    USPC .................. 257/287, 347, E21.09; 438/222, 438/391, 482, 487, 488, 489, 490, 479–509
    See application file for complete search history.

(56) References Cited

U.S. PATENT DOCUMENTS

| 6,322,625 | B2 * | 11/2001 | Im | 117/43 |
|---|---|---|---|---|
| 6,387,779 | B1 * | 5/2002 | Yi et al. | 438/486 |
| 6,475,835 | B1 * | 11/2002 | Hu et al. | 438/147 |
| 7,179,694 | B2 * | 2/2007 | Hiroshima | 438/149 |
| 2003/0094611 | A1 * | 5/2003 | Hayakawa | 257/49 |
| 2004/0079944 | A1 * | 4/2004 | Hiroshima et al. | 257/66 |
| 2005/0233510 | A1 * | 10/2005 | Hiroshima | 438/166 |
| 2005/0277235 | A1 * | 12/2005 | Son et al. | 438/166 |
| 2006/0084204 | A1 * | 4/2006 | Yin et al. | 438/149 |
| 2006/0208286 | A1 * | 9/2006 | Shimada | 257/287 |

FOREIGN PATENT DOCUMENTS

JP      04-278520      10/1992

(Continued)

OTHER PUBLICATIONS

Office Action dated Aug. 29, 2007 in corresponding Korean Patent Application No. 10-2006-0113898.

(Continued)

*Primary Examiner* — Mamadou Diallo
*Assistant Examiner* — John P Dulka
(74) *Attorney, Agent, or Firm* — Harness, Dickey & Pierce P.L.C.

(57) ABSTRACT

A method of fabricating a single crystal silicon rod may include forming an insulation layer on a substrate, forming a hole in the insulation layer, selectively growing silicon in the hole, forming a silicon layer on the hole and on the insulation layer, forming a rod pattern on the silicon layer in a direction that is non-radial with respect to the hole, and melting the silicon layer and crystallizing the silicon layer by illuminating a laser beam on the silicon layer where the rod pattern is formed to generate a nucleation site at a position corresponding to the hole. According to the method, a single crystal silicon rod having no defects may be formed.

17 Claims, 10 Drawing Sheets

FOREIGN PATENT DOCUMENTS

| | | | |
|---|---|---|---|
| JP | 04278520 A | * | 10/1992 |
| JP | 2001308008 A | * | 11/2001 |
| JP | 2002-093705 A | | 3/2002 |
| JP | 2004-006800 A | | 1/2004 |
| JP | 2006-093715 A | | 4/2006 |
| JP | 2006-108608 A | | 4/2006 |

OTHER PUBLICATIONS

Japanese Office Action dated Jan. 22, 2013 issued in Japanese Application No. 2007-298509.

* cited by examiner

SINGLE CRYSTAL SILICON ROD FABRICATION METHODS AND A SINGLE CRYSTAL SILICON ROD STRUCTURE

PRIORITY STATEMENT

This application claims priority under 35 USC §119 to Korean Patent Application No. 10-2006-0113898, filed on Nov. 17, 2006, in the Korean Intellectual Property Office (KIPO), the entire contents of which are incorporated herein by reference.

BACKGROUND

1. Field

Example embodiments relate to methods of fabricating a single crystal silicon rod and a single crystal silicon rod structure. Other example embodiments relate to methods of fabricating a single crystal silicon rod having relatively no defects by forming and recrystallizing a rod in a portion of a silicon layer and a single crystal silicon rod structure.

2. Description of the Related Art

When amorphous silicon is cooled or solidified after being melted during the supply of energy using a laser, crystallization of silicon extracted as a crystal may be performed. According to the crystal growth of silicon grains, when a direction in which the silicon crystal grows is uniform, a single crystal may be obtained. When a plurality of crystals grows simultaneously at random, a polycrystal may be obtained.

When an amorphous silicon thin film is crystallized and used as an active layer of a thin film transistor or a channel region of a semiconductor device, the size of the silicon grain may increase in order to decrease the number of grain boundaries that interrupt the movement of carriers so that the characteristics of the device may improve.

When the amorphous silicon is applied to the device, mobility of electrical charges may be relatively low so that realization of a high speed operation may be difficult. Thus, the amorphous silicon for the device with a high resolution display may be difficult to use. To solve this problem, a thin film transistor may be formed after forming a polycrystalline silicon by crystallizing the amorphous silicon. The channel region of the thin film transistor may be formed of polycrystalline silicon. The charge mobility of the polycrystalline silicon may be about 100 times faster or more than that of amorphous silicon.

A method of fabricating polycrystalline silicon having a relatively large grain size may include a method of crystallizing an amorphous silicon thin film deposited on a substrate, for example, an excimer laser annealing (ELA) method and a solid phase crystallization (SPC) method. A metal induced lateral crystallization (MILC) method, which is an improved version of the ELA method or a continuous grain solidification (CGS) method, may be widely used. Also, a micro-Czochralski process may be used in which a hole is formed in an insulation layer and the amorphous silicon filling the hole is crystallized using a laser. All these methods employ crystallizing an amorphous silicon thin film into a polycrystalline silicon thin film.

However, a relatively large number of grain boundaries may still remain in the polycrystalline silicon thin film so that the flow of charges may be interrupted. Thus, to obtain improved electrical characteristics, the entire region, where a channel of a thin film transistor or a semiconductor device is formed, may be formed of a single crystal silicon.

SUMMARY

Example embodiments provide methods of fabricating a single crystal silicon rod having relatively no defects and a single crystal silicon rod structure. The single crystal silicon rod may be fabricated by forming the single crystal silicon rod at a position that is not linear with respect to a rod by forming a rod pattern in a portion of a silicon layer and performing silicon crystallization so that a channel of a thin film transistor or a semiconductor device may be formed of a single crystal silicon having relatively no defects.

According to example embodiments, a method of fabricating a single crystal silicon rod may include forming an insulation layer on a substrate, forming a hole in the insulation layer, giving a selective growth to silicon in the hole, forming a silicon layer on the hole and on the insulation layer, forming a rod pattern on the silicon layer in a non-radial direction with respect to the hole, and melting the silicon layer and crystallizing the silicon layer by illuminating a laser beam on the silicon layer, wherein the rod pattern is formed to generate a nucleation site at a position corresponding to the hole.

The depth of the hole may be smaller than the thickness of the insulation layer. The insulation layer may include a first insulation layer and a second insulation layer between the first insulation layer and the silicon layer. The first insulation layer may be formed of $SiO_2$ and the second insulation layer may be formed of $Si_3N_4$. The hole may penetrate the insulation layer and contact the substrate. The method may further include a polycrystalline silicon layer between the substrate and the insulation layer. The method may further include a first insulation layer between the substrate and the polycrystalline silicon layer, wherein the insulation layer may include a second insulation layer on the polycrystalline silicon layer and a third insulation layer between the second insulation layer and the silicon layer.

The second insulation layer may be formed of $SiO_2$ and the third insulation layer may be formed of $Si_3N_4$. The insulation layer may be formed of at least one selected from a group consisting of $SiO_2$, $Al_2O_3$, $Si_3N_4$, and AlN. The number of the hole may be one or more. The diameter of the hole may be between about 1 nm-about 300 nm. The depth of the hole may be between about 10 nm-about 300 nm.

The silicon layer may be formed of amorphous or polycrystalline silicon, or amorphous or polycrystalline silicon germanium (SiGe). The lengthwise direction of the rod may not match a radial direction extending from the hole. The number of the rod may be one or more. The width of the rod may be between about 5 nm-about 1000 nm. The width of the rod may be between about 20 nm-about 150 nm.

According to example embodiments, a method of fabricating a single crystal silicon rod may include forming a silicon layer to include a preliminary nucleation site on a substrate, patterning a rod on the silicon layer in a non-radial direction with respect to the preliminary nucleation site, and melting the silicon layer where the rod is patterned and crystallizing the silicon layer by emitting a laser beam to generate a crystal seed at a position corresponding to the preliminary nucleation site. The preliminary nucleation site may be formed in a metal catalyst coating method or a mask pattern forming method. The metal catalyst may be one selected from a group consisting of Ni, Cu, Al, ad Pd.

According to example embodiments, a single crystal silicon rod structure may include a polycrystalline silicon main body portion having a radial grain boundary formed from a nucleation site, and a single crystal silicon rod connected to the silicon main body portion in a non-radial direction from the nucleation site. The single crystal silicon rod may be formed on a silicon substrate. The single crystal silicon rod may be formed on a silicon substrate in a bridge structure. According to example embodiments, there is provided a GAA transistor including the above single crystal silicon rod structure and a NAND flash memory including the single crystal silicon rod structure.

BRIEF DESCRIPTION OF THE DRAWINGS

Example embodiments will be more clearly understood from the following detailed description taken in conjunction with the accompanying drawings. FIGS. 1-18 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments will be described more fully with reference to the accompanying drawings, in which example embodiments are shown. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
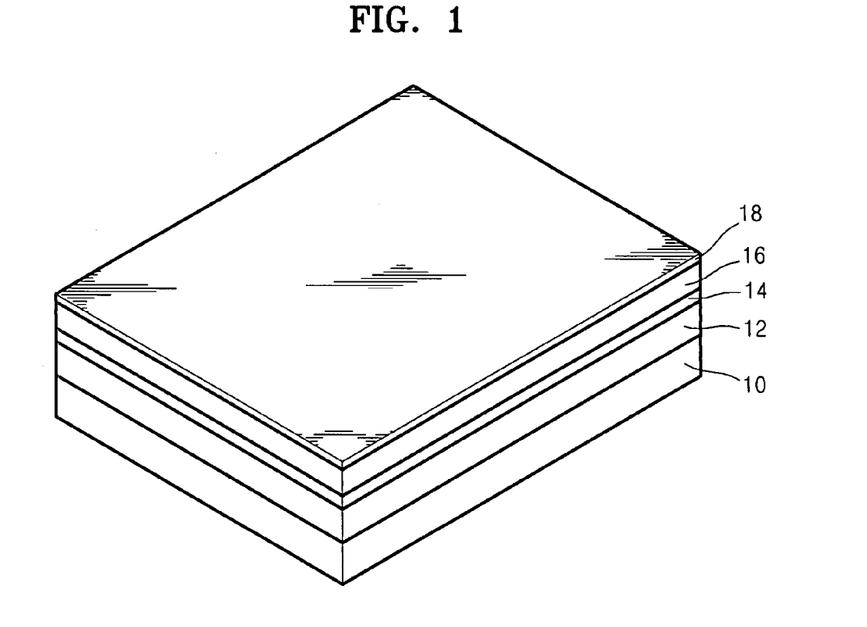
FIGS. 1-17 illustrate a method of fabricating a single crystal silicon rod according to example embodiments.

FIGS. 1-9 illustrate a method of fabricating a single crystal silicon rod according to example embodiments. Referring to FIG. 1, a first insulation layer 12, a polycrystalline silicon layer 14, a second insulation layer 16, and a third insulation layer 18 may be sequentially formed on a substrate 10. The substrate 10 may be an insulating substrate, for example, a silicon substrate. The first through third insulation layers 12, 16, and 18 may be formed of any one selected from a group consisting of $SiO_2$, $Al_2O_3$, $Si_3N_4$, and AlN. For example, the first insulation layer 12 and the second insulation layer 16 may be formed of $SiO_2$ and the third insulation layer 18 may be formed of $Si_3N_4$.

The third insulation layer 18 may function as a clogging protective layer which exhibits improved adhesion with melted liquid silicon and may prevent or reduce the flow and clogging of liquid silicon when a laser beam is illuminated to recrystallize or crystallize a below-described silicon layer 24 of FIG. 4. A material having relatively low boundary energy with the liquid silicon may be used as the clogging protective layer, for example, a $Si_3N_4$ layer.

Figure 2A:
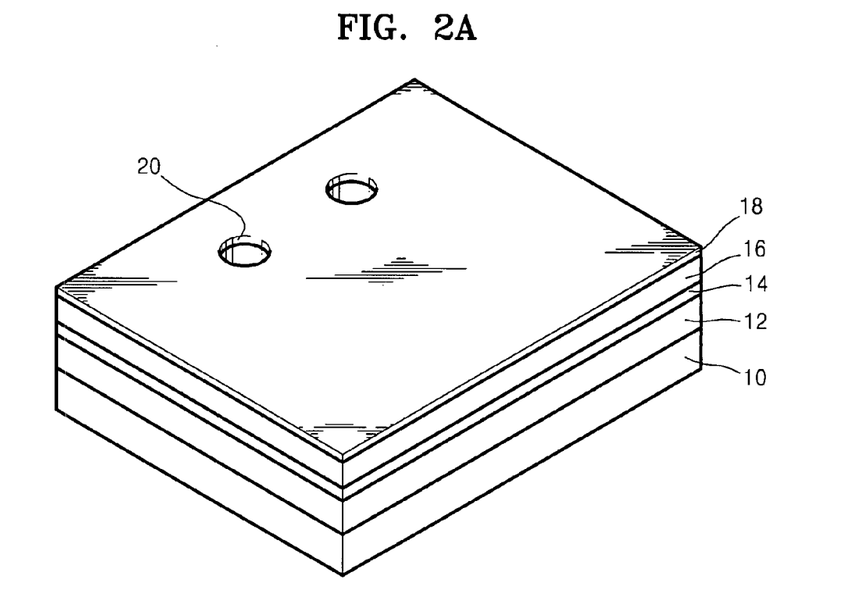
Figure 2B:
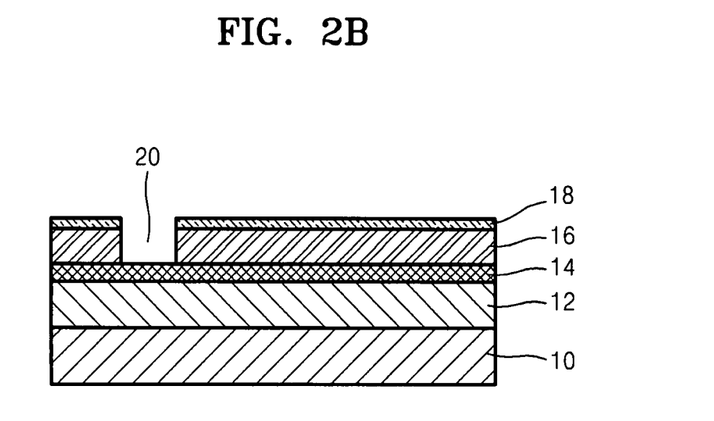

Referring to FIGS. 2A and 2B, a first hole 20 may be formed in the second and third insulation layers 16 and 18 by lithography and etching. The first hole 20 may be used as a contact hole to allow contact between the silicon layer 24 of FIG. 4 and the polycrystalline silicon layer 14. The first hole 20 may be formed to the surface of the polycrystalline silicon layer 14 as shown in FIG. 2B and the depth of the first hole 20 may be between about 10 nm-about 300 nm. The diameter of the first hole 20 may be between about 1 nm-about 300 nm. One or more first holes 20 may be formed. FIG. 2A shows an example of forming two first holes 20.

Figure 3:
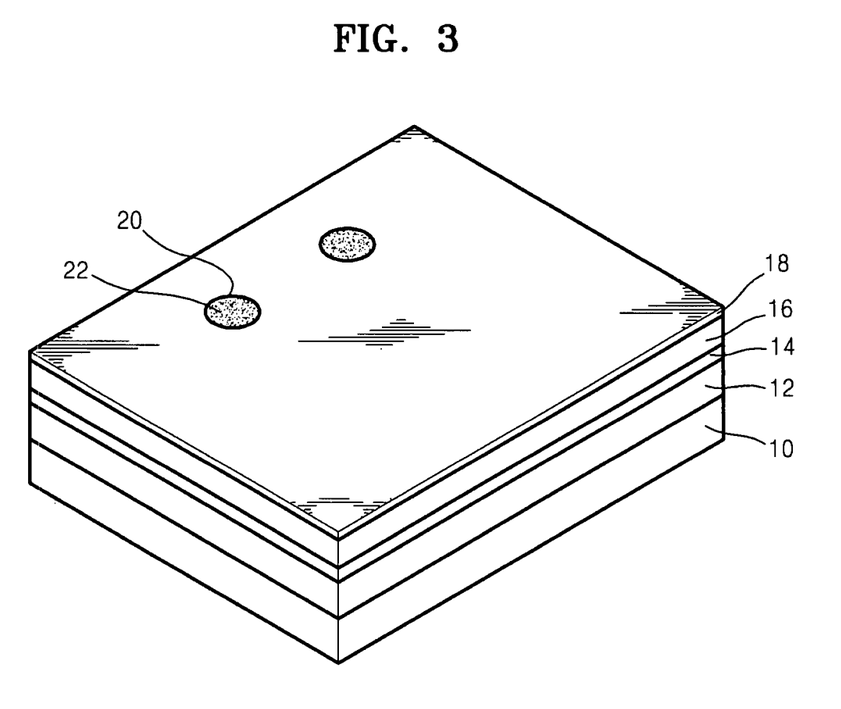
Figure 4:
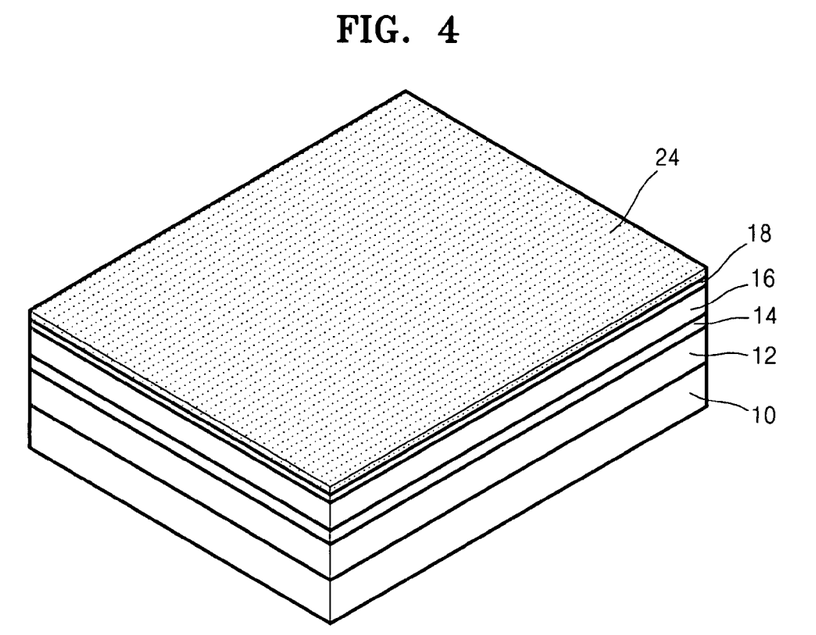

As illustrated in FIGS. 3 and 4, the silicon layer 24 may be formed in the first hole 20 and on the third insulation layer 18. The silicon layer 24 may be formed of silicon or silicon germanium (SiGe) either amorphous or polycrystalline. In the following description, although the material of the silicon layer 24 is described as silicon for the convenience of explanation, this does not mean that the silicon layer 24 may be formed of only silicon. The term "silicon" should be interpreted to indicate either silicon and/or silicon germanium.

A silicon layer hole portion 22 may be selectively grown in the first hole 20 to fill the first hole 20 using a UHV CVD (ultra-high vacuum chemical vapor deposition) method and/or a LPCVD (low-pressure chemical vapor deposition) method. The silicon layer 24 may be formed on the first hole 20 filled with the silicon layer hole portion 22 and on the entire surface of the third insulation layer 18. For example, after performing diluted HF cleaning with respect to the substrate configured as above by using UHV CVD or LPCVD equipment, polycrystalline silicon may be selectively grown to fill the first hole 20. The incubation time of silicon, for example, polycrystalline silicon, may be shorter than that in $Si_3N_4$, a material for the third insulation layer 18. In another example, the silicon layer 24 may be formed using a PECVD (plasma enhanced chemical vapor deposition) method. For example, polycrystalline silicon or amorphous silicon may be deposited using a PECVD method such that the surface of the silicon deposited in the first hole 20 is higher than the surface of $Si_3N_4$ used as a material for the third insulation layer 18.

After the first hole 20 is filled with the silicon layer hole portion 22 of amorphous or polycrystalline silicon, the silicon layer 24 may be formed by depositing a planarized polycrystalline silicon or amorphous silicon thin film on the first hole 20 filled with the silicon layer hole portion 22 and on the entire surface of the third insulation layer 18.

Figure 5:
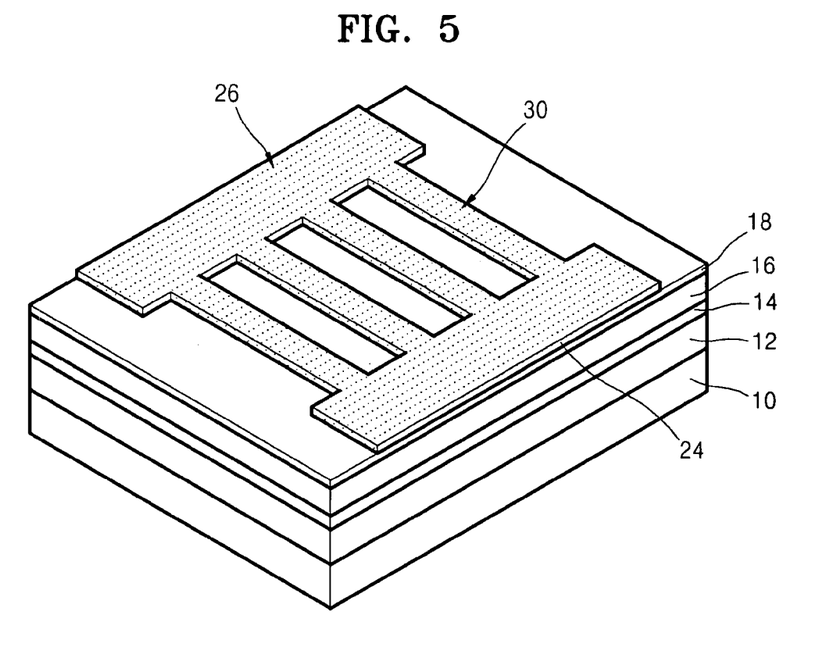

Referring to FIG. 5, a rod 30 used as a silicon channel, and a silicon main body portion 26 that is a portion other than the rod 30, may be formed by patterning the silicon layer 24 by lithography and etching processes. The area where the first hole 20 is located is included in the silicon main body portion 26. The rod 30 may be formed such that the lengthwise direction thereof is arranged in a direction that is not a radial direction of the first hole 20. For example, a rod pattern may be formed such that a start portion of the rod 30 (a start portion of the silicon channel) and the first hole 20 maintain a positional and angular relation. The width of the rod 30 may be between about 5 nm-about 1000 nm, for example, about 20 nm-about 150 nm.

Figure 6:
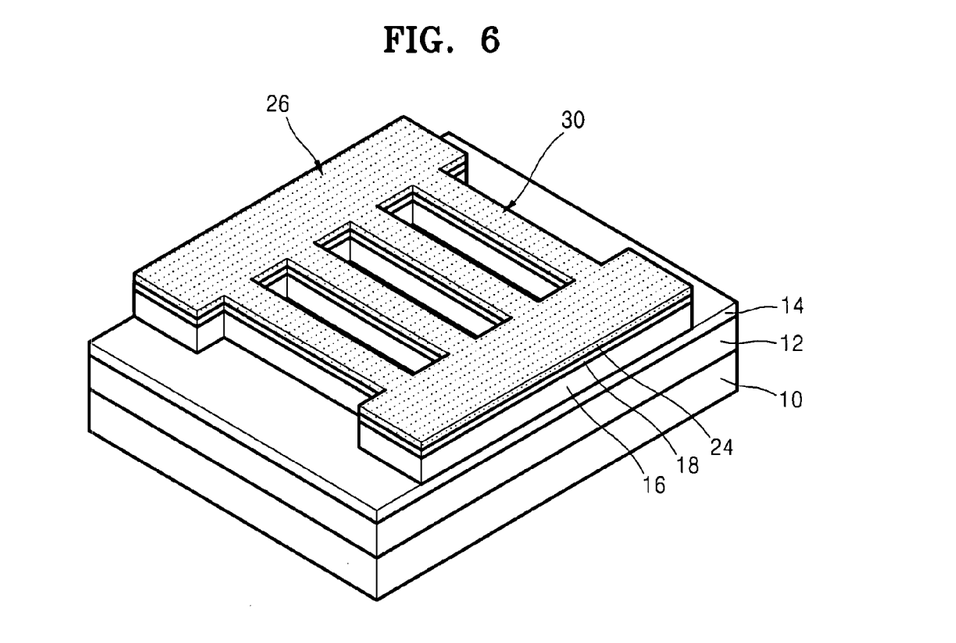
Figure 7:
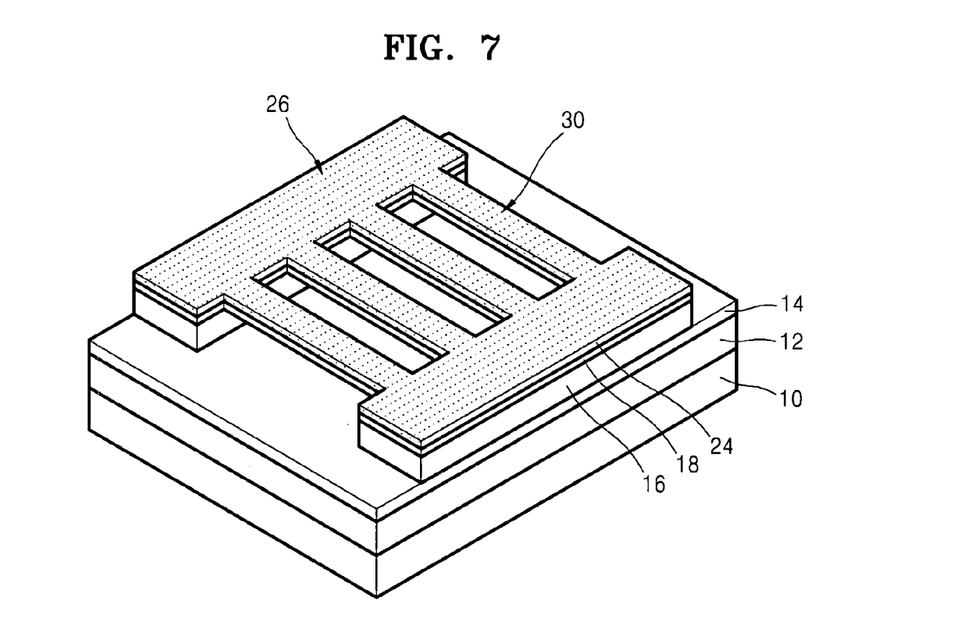

Referring to FIG. 6, the second and third insulation layers 16 and 18 may be etched and removed according to the rod pattern. Then, as shown in FIG. 7, the portions of the second insulation layer 16, for example, the $SiO_2$ layer, remaining under the rod 30 may be removed by undercut etching to form a bridge structure. The undercut etching may be performed using a wet etching method. When the second insulation layer 16 under the rod 30 is removed, a channel formed of the rod 30 and the third insulation layer 18, for example, a channel formed of silicon/$Si_3N_4$, may be formed. However, the process illustrated in FIGS. 6 and 7 may not be essential in example embodiments.

Figure 8:
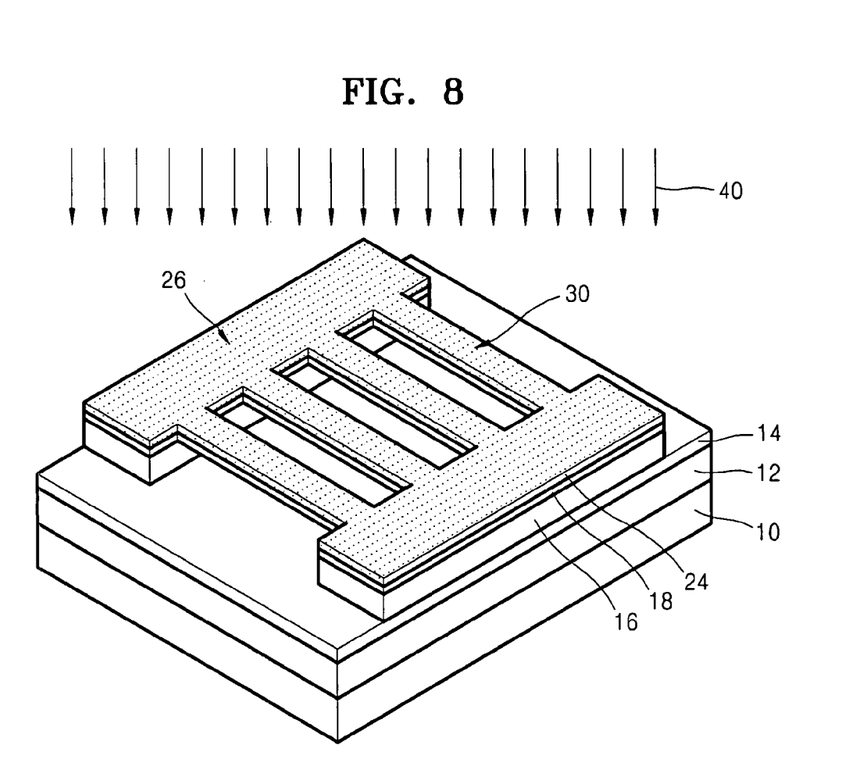
Figure 9:
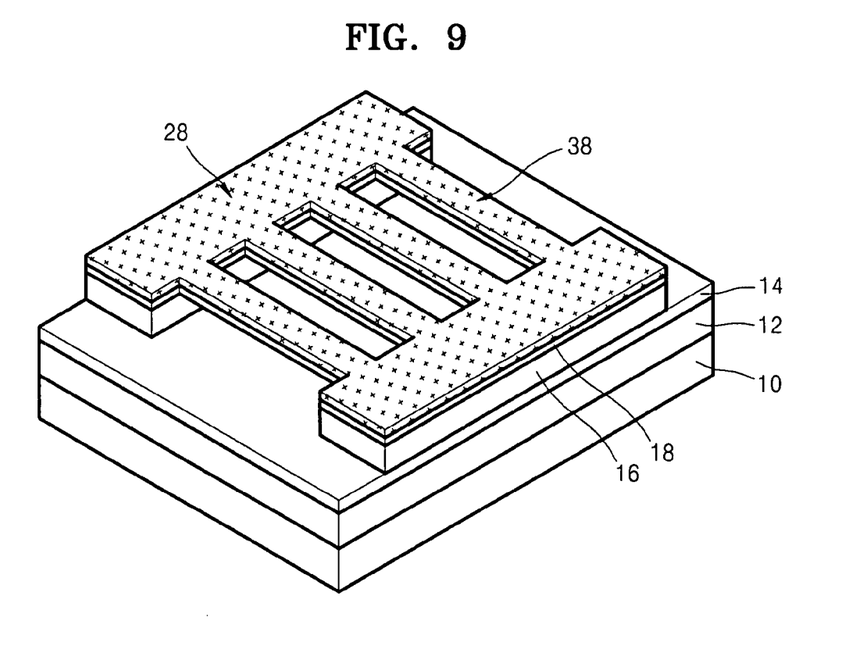

Referring to FIGS. 8 and 9, the silicon layer 24 of the rod 30 and the silicon main body portion 26 may be melted and crystallized by illuminating a laser beam 40 onto the top of the patterned rod 30 and silicon main body portion 26. Accordingly, when the silicon layer 24 is formed of polycrystalline silicon, the polycrystalline silicon may be recrystallized, and when the silicon layer 24 is formed of amorphous silicon, the amorphous silicon may be crystallized. Because silicon crystallization includes both recrystallization of polycrystalline silicon and crystallization of amorphous silicon, the recrystallization of polycrystalline silicon and the crystallization of amorphous silicon will be simply expressed as silicon crystallization in the following description.

An excimer laser, for example, may be used for the crystallization. The energy density of the laser may be determined such that the rod 30, for example, the silicon channel, and the silicon main body portion 26 may be completely melted but the polycrystalline silicon layer 14 in the lower portion of the first hole 20 formed under the silicon main body portion 26 may not be completely melted. The silicon in the lower portion of the first hole 20 may be connected to the polycrystalline silicon layer 14 so as to be sufficiently thicker than the silicon of the silicon channel portion. The region of the polycrystalline silicon layer 14 in the lower portion of the first hole 20 may function as a crystal seed of the silicon when the illumination of the laser beam is discontinued.

The polycrystalline silicon may grow using the region of the polycrystalline silicon layer 14 in the lower portion of the first hole 20 as the crystal seed in a silicon crystallization process. Because the polycrystalline silicon in the bottom portion of the first hole 20 is not completely melted, the polycrystalline silicon portion that is not completely melted may become a nucleation site and may act as the crystal seed.

During the silicon crystallization, the polycrystalline silicon may grow vertically to the surface of the silicon main body portion 26 and then may grow laterally to the rod 30. A grain may be formed in a sufficiently large area in a radial direction around the first hole 20. When the silicon in the area is completely melted by sufficient laser energy, other nucleation sites may not be generated.

For example, the silicon crystallization may be performed with a seed of the polycrystalline silicon layer 14 in the lower portion of the first hole 20. When the thickness of the amorphous silicon or polycrystalline silicon thin film on the $Si_3N_4$ layer is about 50 nm, a radial grain may be formed within a radius of about 2 μm or more around the first hole 20. No other nucleation site may be generated in the area.

During the crystallization of silicon, the rod 30 may be placed in a non-radial direction with respect to the first hole 20 so that the position of the first hole 20 and the channel start portion form a particular angle. Thus, a grain boundary may be filtered at the channel start portion so that the rod 30 may have a single crystallization feature and may form a single crystal silicon having no defects.

Therefore, from the above silicon crystallization process, as shown in FIG. 9, a silicon main body portion 28 formed of polycrystalline silicon and a rod 38 formed of a single crystal silicon having no defects, for example, a single crystal silicon channel, may be obtained. According to the above-described fabrication method, the single crystal silicon channel having no defects may be formed because the silicon in the channel area may remain in a melted state while the silicon layer 24 starts growing from the crystal seed in the polycrystalline silicon layer 14 in the bottom of the first hole 20 and undergoes vertical growth and lateral growth to the rod 30, for example, the channel area.

According to example embodiments, the polycrystalline silicon may be recrystallized or the amorphous silicon may be crystallized using a pulse excimer laser in the state shown in FIG. 6 or FIG. 7. To improve efficiency in the crystallization, the crystallization may be carried out after a capping layer formed of $SiO_2$ is deposited in the thickness between about 50 nm-about 500 nm.

Figure 10:
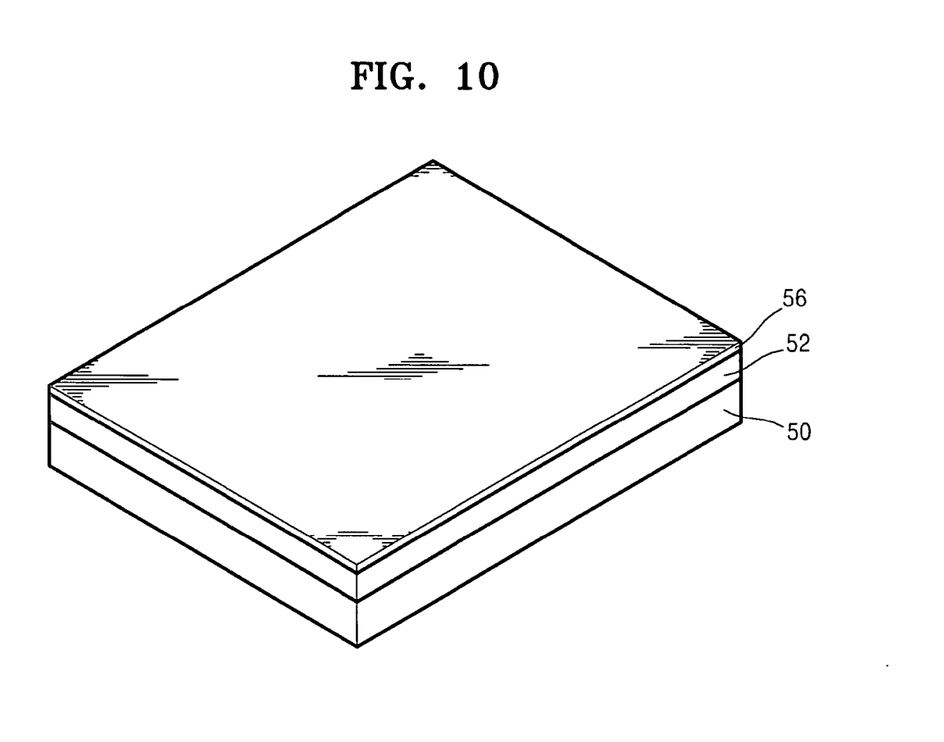

FIGS. 10-17 illustrate a method of fabricating a single crystal silicon rod according to example embodiments. Referring to FIG. 10, a first insulation layer 52 and a second insulation layer 56 may be sequentially formed on a substrate 50. The substrate 50 may be a silicon substrate and/or an insulation substrate, for example, a silicon substrate. The first and second insulation layers 52 and 56 may be formed of one selected from a group consisting of $SiO_2$, $Al_2O_3$, $Si_3N_4$, and AlN. For example, the first insulation layer 52 may be formed of $SiO_2$ and the second insulation layer 56 may be formed of $Si_3N_4$. The second insulation layer 56 may function as a clogging protective layer like the third insulation layer 18 described with reference to example embodiments illustrated in FIGS. 1-9.

Figure 11A:
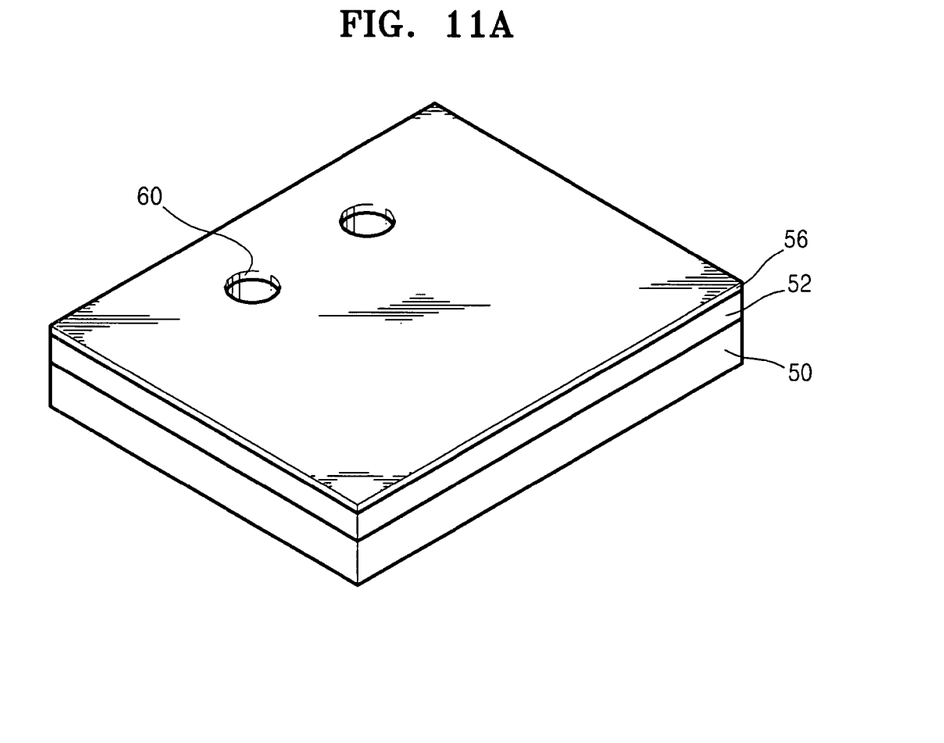
Figure 11B:
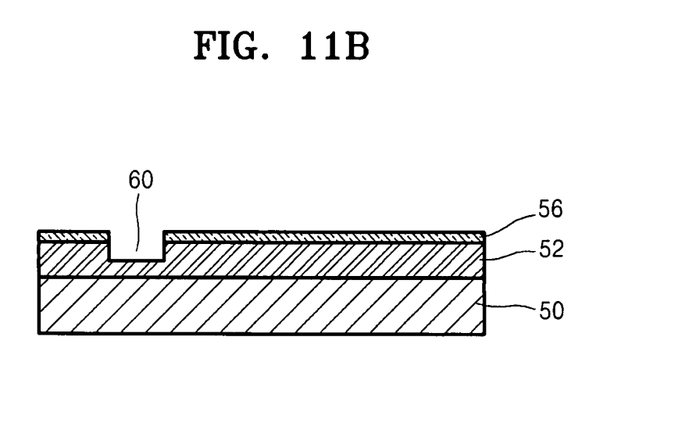

Referring to FIGS. 11A and 11B, a second hole 60 may be formed in the first and second insulation layers 52 and 56. The depth of the second hole 60 may be smaller than the sum of the thicknesses of the first and second insulation layers 52 and 56. As illustrated in FIG. 11B, the second hole 60 may be formed in only a portion of the first insulation layer 52. The diameter of the second hole 60 may be between about 1 nm-about 300 nm. One or more second holes 60 may be formed. FIG. 11A shows an example in which two second holes 60 are formed.

Figure 12:
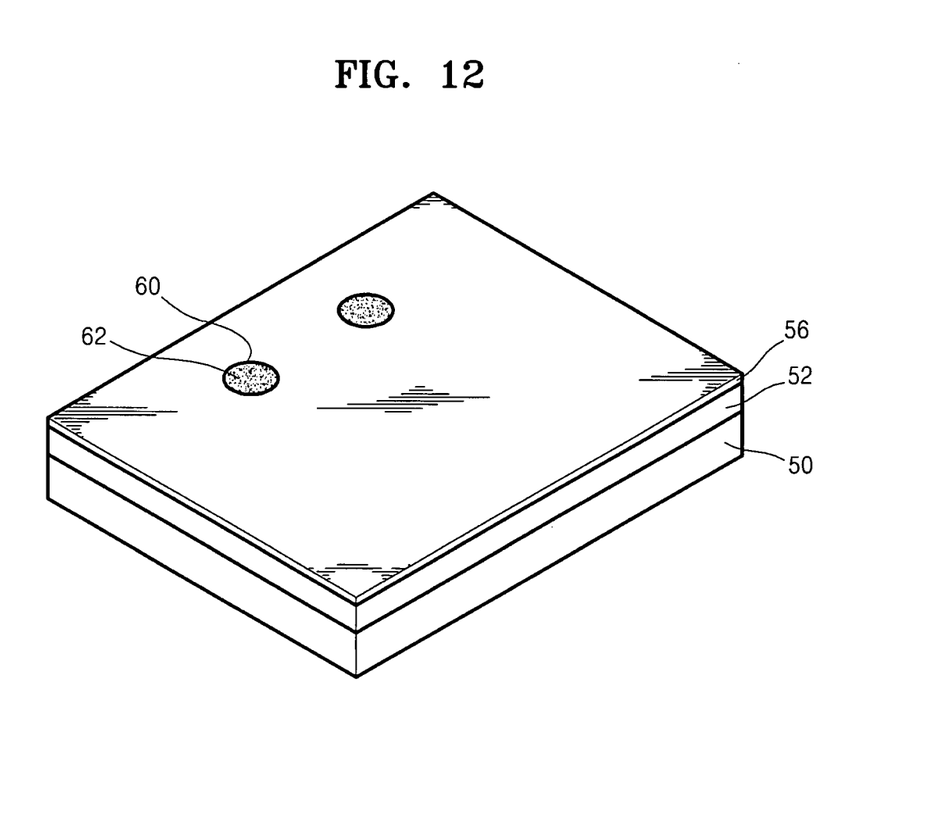
Figure 13:
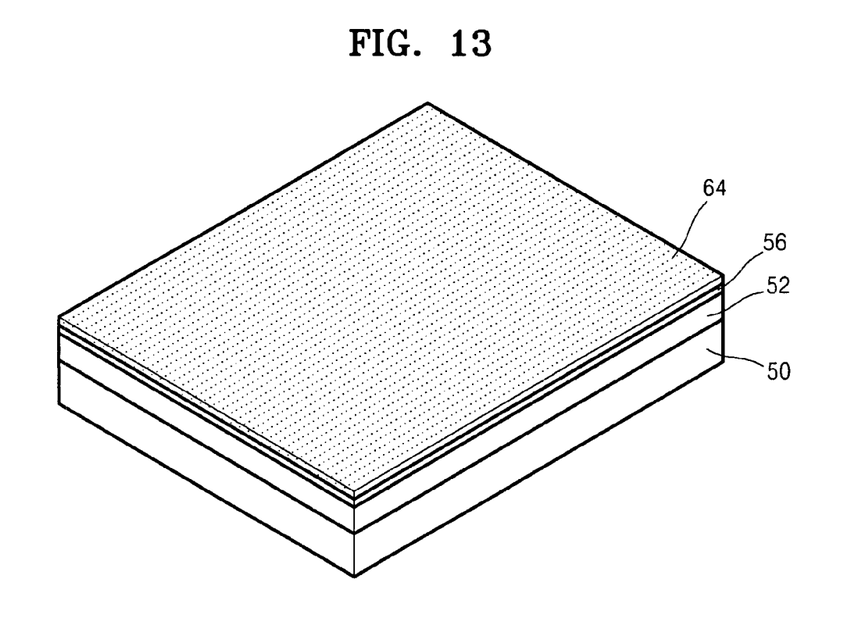

As illustrated in FIGS. 12 and 13, a silicon layer 64 may be formed on the second hole 60 and on the second insulation layer 56. A silicon layer hole portion 62 may be selectively grown in the second hole 60 in order to fill second hole 60. A silicon layer 64 may be formed on the second hole 60 filled with the silicon layer hole portion 62 in which the silicon layer 62 continues the selective growth and on the entire surface of the second insulation layer 56. The silicon layer hole portion 62 and the silicon layer 64 may be amorphous or polycrystalline silicon or silicon germanium (SiGe) like the silicon layer 24 according to example embodiments illustrated in FIGS. 1-9. One of the silicon layer hole portion 62 and the silicon layer 64 may be formed of amorphous silicon and the other may be formed of polycrystalline silicon or both may be identically formed of either amorphous silicon or polycrystalline silicon.

Figure 14:
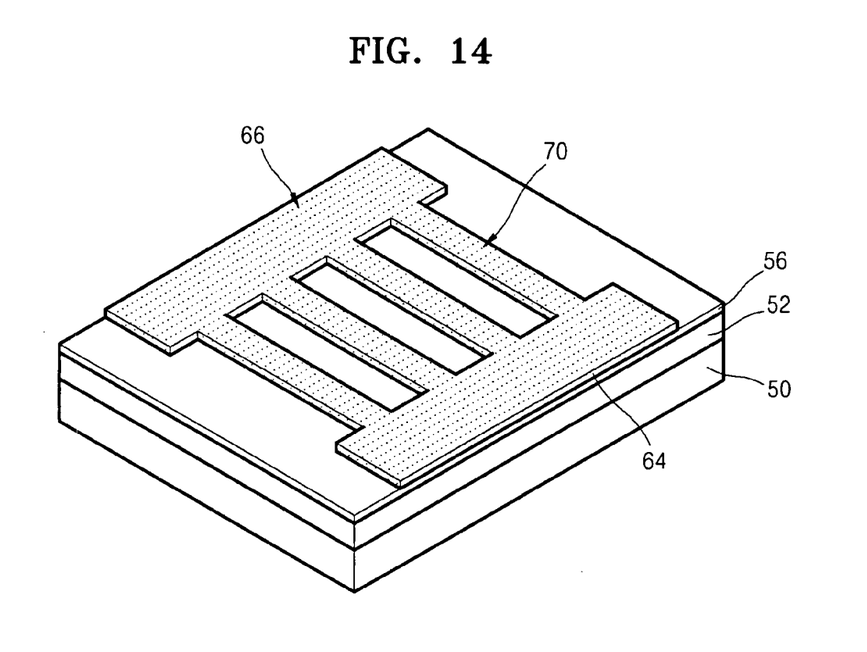

Referring to FIG. 14, a rod 70 used as a silicon channel, and a silicon main body portion 66 that is a portion other than the rod 30, may be formed by patterning the silicon layer 64. The second hole 60 may be located under the silicon main body portion 66. A rod pattern may be formed such that the lengthwise direction of the rod 66 is placed in a direction that is not a radial direction extending from the second hole 60. The width of the rod 70 may be between about 5 nm-about 1000 nm, for example, about 20 nm-about 150 nm.

Figure 15:
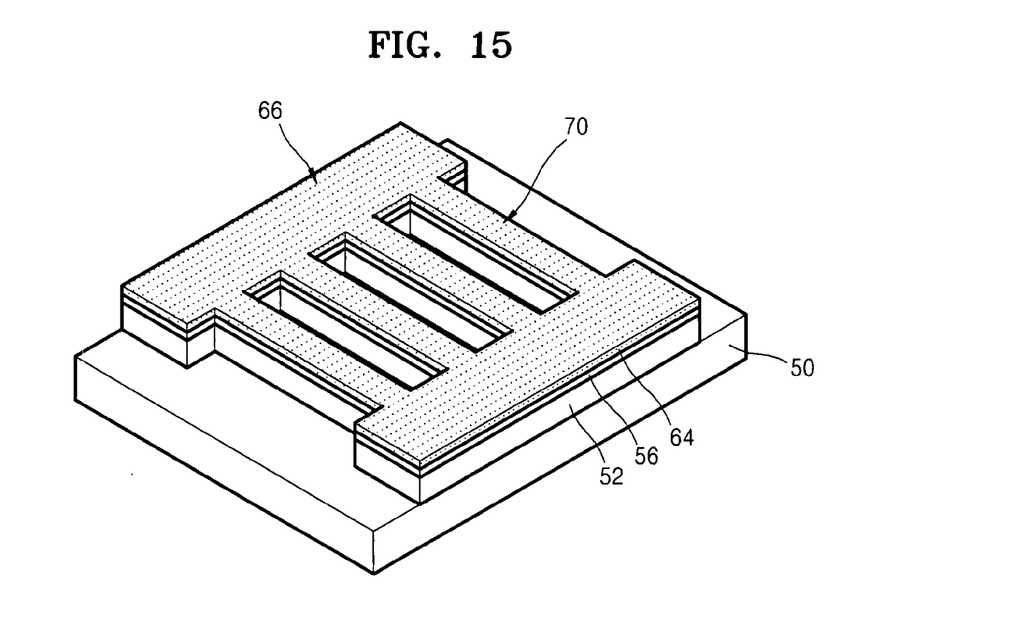
Figure 16:
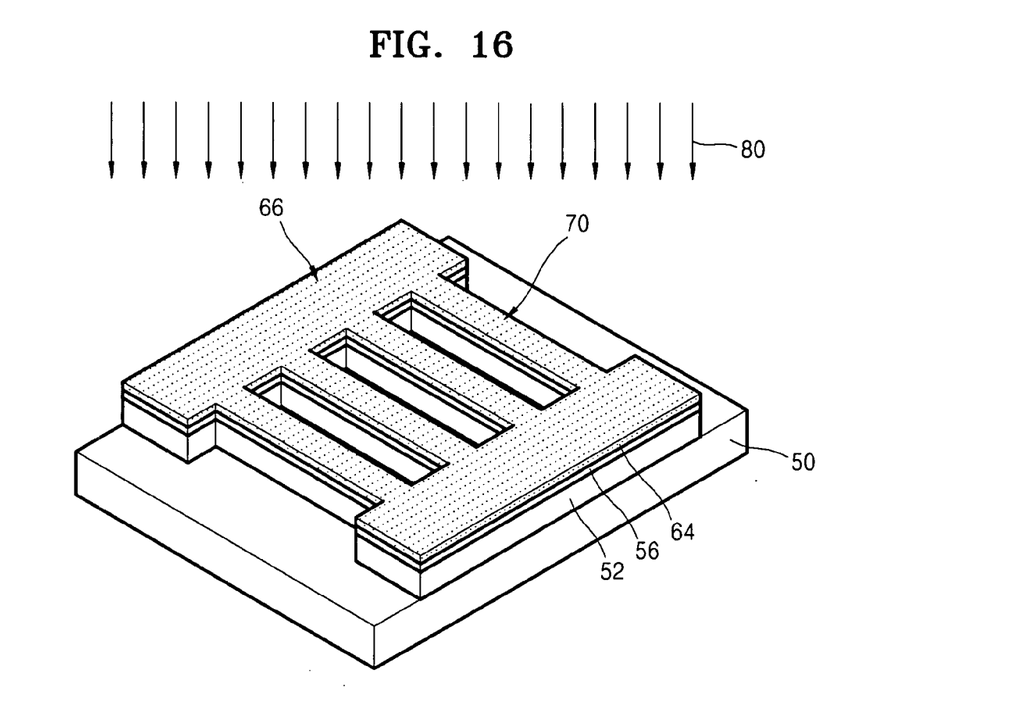
Figure 17:
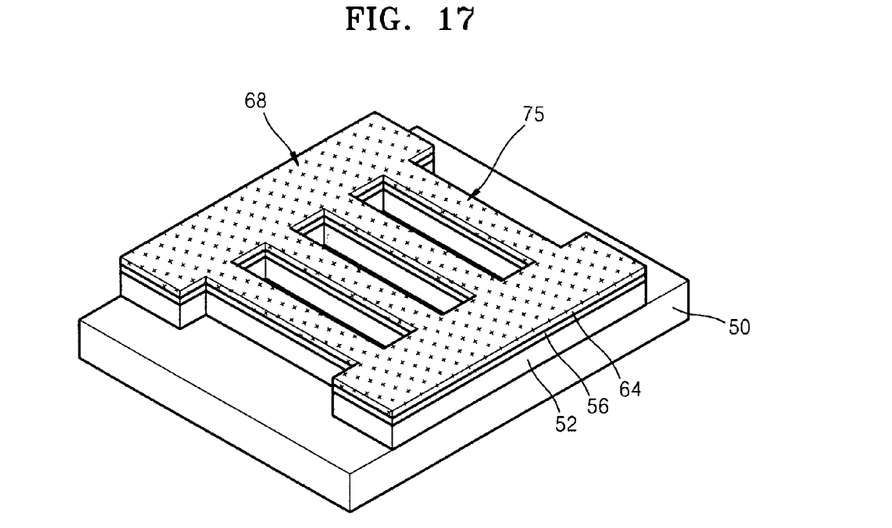

Referring to FIGS. 15-17, the first and second insulation layers 52 and 56 may be etched and removed according to the rod pattern. The silicon layer 64 of the rod 70 and the silicon main body portion 66 may be melted and crystallized by vertically emitting a laser beam 80 onto the patterned rod 70 and silicon main body portion 66. An excimer layer, for example, may be used for the silicon crystallization. The energy density of laser may be determined such that the rod 70 and the silicon main body portion 66 are completely melted but the silicon layer hole portion 62 of the second hole 60 formed in the silicon main body portion 66 is not completely melted.

For example, the laser may be illuminated such that at least part of the silicon layer hole portion 62 remains in the lower portion of the second hole 60 without being melted. The silicon layer hole portion 62 in the second hole 60 may be thicker than the silicon layer 64 of the rod 70 and the silicon main body portion 66. The unmelted silicon in the lower portion of the second hole 60 may function as a crystal seed where the growth of crystal starts when the illumination of the laser beam is discontinued. The silicon may grow vertically using the unmelted silicon in the second hole 60 as the crystal seed and then may grow laterally toward the rod 70. A grain in a radial direction may be formed in an area around the second hole 60 and other nucleation sites may not be generated in the area. During the crystallization of silicon, because the rod 70 is placed in a non-radial direction with respect to the second hole 60, a grain boundary may be filtered at a channel start portion so that the silicon of the rod 70 may have single crystallization and accordingly may form a single crystal silicon channel having no defects.

Therefore, from the above silicon crystallization process, as shown in FIG. 17, a silicon main body portion 68 formed of polycrystalline silicon and a rod 75 formed of a single crystal silicon having no defects, for example, a single crystal silicon channel, may be obtained.

Figure 18:
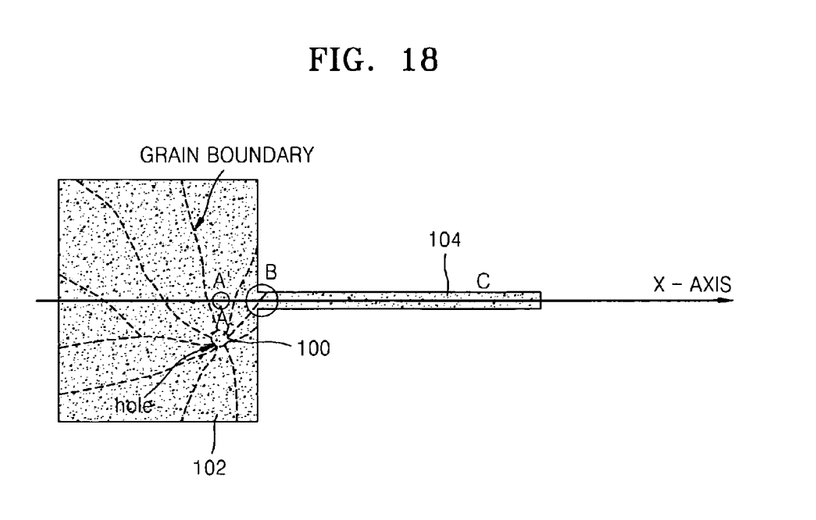
FIG. 18 illustrates the principle of forming a single crystal silicon rod structure according to example embodiments.

FIG. 18 illustrates the principle of forming a single crystal silicon rod structure according to example embodiments. Referring to FIG. 18, according to example embodiments, a single crystal silicon rod structure may include a polycrystalline silicon main body portion 102 having a radial grain boundary formed from a preliminary nucleation position 100 and a single crystal silicon rod 104 connected to the polycrystalline silicon main body portion 102 in a non-radial direction from the preliminary nucleation position 100. The single crystal silicon rod 104 may be formed as a bridge structure on the silicon substrate by removing the insulation layer below the single crystal silicon rod 104.

In FIG. 18, point A is the preliminary nucleation position 100 in the silicon layer formed on the substrate. Point A' is a point obtained by projecting point A on an x-axis. Point B is a point where the rod 104 starts on the silicon layer and is a silicon channel start portion. Point C is an arbitrary point on the rod 104. The preliminary nucleation position 100 corresponds to the first or second hole 20 or 60 of the above-described embodiments.

In the crystallization process, the grain boundary may be distributed in a radial direction around point A as shown in FIG. 18. Because the rod 104 is formed in a non-radial direction at an angle, not linearly, the grain boundary may be filtered at point B where the polycrystalline silicon main body portion 102 and the rod 104 meet so that a single crystal silicon having no defects may be formed at point C where the rod 104 is formed. In the above example embodiments, the preliminary nucleation position may be formed in a method employed in forming a hole. However, example embodiments may not be limited to the method and the preliminary nucleation position may be formed in a metal catalyst coating method and/or a mask pattern forming method.

In the method of forming the preliminary nucleation position using a metal catalyst, silicon may be crystallized by coating a metal catalyst on the amorphous silicon or polycrystalline silicon and illuminating a laser beam thereon. The metal catalyst may be one selected from a group consisting of Ni, Cu, Al, and Pd. In a process of illuminating a laser beam and cooling, metal may become a catalyst to produce metal silicide and the silicon may be crystallized. This method may reduce a process temperature by using the metal catalyst.

In the method of forming the preliminary nucleation position using the mask pattern, a mask pattern may be formed on the amorphous silicon or polycrystalline silicon and a laser beam may be illuminated thereon so that crystallized silicon may be formed during a cooling process. The mask material may be photoresist or metal material. A portion of the silicon exposed to the laser beam may be completely melted, but the silicon in the lower portion of the mask pattern may not be melted so that the unmelted silicon becomes a crystal seed, forming crystal silicon. The single crystal silicon rod structure may be applied to the channel of a GAA (gate all around) transistor and a NAND flash memory.

When the single crystal silicon rod structure according to example embodiments is applied to the GAA transistor, the polycrystalline silicon main body portion may become a source S or a drain D while the single crystal silicon rod becomes a channel. Thus, a pair of the polycrystalline silicon main body portions may be formed as a structure connected by the single crystal silicon rod. Also, a gate insulator may be formed and a gate process may be performed to form a gate to cross the single crystal silicon rod. As a result, a GAA transistor may be obtained.

The rod type channel may be formed by selectively etching the insulation layer under the single crystal silicon channel, for example, $Si_3N_4$, and performing a high heat treatment in an atmosphere of $H_2$. Also, the gate insulator may be formed by thermal oxidation or by depositing a high-k dielectric material using an ALD (atomic layer deposition) method.

As described above, example embodiments form a single crystal silicon (Si or SiGe) channel having no defects on a substrate having no crystal seed using a pulse excimer laser crystallization technique. This technology may be applied to the fabrication of a device, e.g., a GAA transistor and/or a NAND flash memory. When the single crystal silicon rod channel structure is repeatedly deposited, a 3D stack IC and a 3D stack memory may be realized.

Also, according to example embodiments, by forming a rod pattern on a portion of the silicon layer and performing the silicon crystallization, a single crystal silicon rod having no defects may be formed from a position that is not linear with the rod. For example, the grain boundary may be filtered during the process of forming a hole in the silicon layer and a rod in a non-radial direction with respect to the hole and melting the silicon using a laser and crystallizing the silicon. Thus, the single crystal silicon may be formed on the rod. Therefore, according to example embodiments, a channel of a thin film transistor or semiconductor device may be formed of single crystal silicon having no defects.

While example embodiments have been particularly shown and described with reference to example embodiments thereof, it will be understood by those skilled in the art that various changes in form and details may be made therein without departing from the spirit and scope of the appended claims.

What is claimed is:

1. A method of fabricating a single crystal silicon rod comprising:
    forming an insulation layer on a substrate;
    forming a hole in the insulation layer;
    selectively growing silicon in the hole;
    forming a silicon layer on the hole and on the insulation layer;
    forming a rod pattern on the silicon layer in a direction that is non-radial with respect to the hole; and
    melting the silicon layer and crystallizing the silicon layer by illuminating a laser beam on the silicon layer where the rod pattern is formed to generate a nucleation site at a position corresponding to the hole and the lengthwise direction of the rod is not a radial direction extending from the hole, the rod pattern being formed of single crystalline silicon,
    wherein a grain boundary is filtered at a channel start portion, the channel start portion being a start portion of the rod during the crystallization of the silicon layer.

2. The method of claim 1, wherein the depth of the hole is smaller than the thickness of the insulation layer.

3. The method of claim 2, wherein the insulation layer includes a first insulation layer and a second insulation layer between the first insulation layer and the silicon layer.

4. The method of claim 3, wherein the first insulation layer is formed of $SiO_2$ and the second insulation layer is formed of $Si_3N_4$.

5. The method of claim 1, wherein the hole penetrates the insulation layer.

6. The method of claim 5, further comprising:
    a polycrystalline silicon layer between the substrate and the insulation layer.

7. The method of claim 6, further comprising:
    a first insulation layer between the substrate and the polycrystalline silicon layer,
    wherein the insulation layer includes:
    a second insulation layer on the polycrystalline silicon layer; and
    a third insulation layer between the second insulation layer and the silicon layer.

8. The method of claim 7, wherein the second insulation layer is formed of $SiO_2$ and the third insulation layer is formed of $Si_3N_4$.

9. The method of claim 1, wherein the insulation layer is formed of at least one selected from the group consisting of $SiO_2$, $Al_2O_3$, $Si_3N_4$, and AlN.

10. The method of claim 1, wherein one or more holes are formed.

11. The method of claim 1, wherein the diameter of the hole is between about 1 nm-about 300 nm.

12. The method of claim 1, wherein the depth of the hole is between about 10 nm-about 300 nm.

13. The method of claim 1, wherein the silicon layer is formed of amorphous or polycrystalline silicon.

14. The method of claim 13, wherein the width of the rod is between about 20 nm-about 150 nm.

15. The method of claim 1, wherein the silicon layer is formed of amorphous or polycrystalline silicon germanium (SiGe).

16. The method of claim 1, wherein one or more rods are formed.

17. The method of claim 1, wherein the width of the rod is between about 5 nm-about 1000 nm.

* * * * *